United States Patent [19]
Rao

[11] Patent Number: 5,761,694
[45] Date of Patent: Jun. 2, 1998

[54] MULTI-BANK MEMORY SYSTEM AND METHOD HAVING ADDRESSES SWITCHED BETWEEN THE ROW AND COLUMN DECODERS IN DIFFERENT BANKS

[75] Inventor: G. R. Mohan Rao, Dallas, Tex.

[73] Assignee: Cirrus Logic, Inc., Fremont, Calif.

[21] Appl. No.: 565,388

[22] Filed: Nov. 30, 1995

[51] Int. Cl.$^6$ .............................. G06F 12/02; G11C 8/00
[52] U.S. Cl. .................. 711/5; 711/105; 711/207; 365/230.03; 365/230.06
[58] Field of Search ..................... 395/405, 431, 395/432, 515, 518, 412, 415, 417, 419, 421; 365/230.02, 230.03, 230.06; 345/200, 201

[56] References Cited

U.S. PATENT DOCUMENTS

| | | | |
|---|---|---|---|
| 4,628,467 | 12/1986 | Nishi et al. | 345/201 |
| 4,803,621 | 2/1989 | Kelly | 711/5 |
| 5,109,360 | 4/1992 | Inazumi et al. | 365/230.03 |
| 5,361,339 | 11/1994 | Kadakia et al. | 365/365 |
| 5,506,810 | 4/1996 | Runas | 365/230.03 |

*Primary Examiner*—Glenn Gossage
*Attorney, Agent, or Firm*—James J. Murphy; Steven A. Shaw

[57] ABSTRACT

A memory subsystem with multiple memory banks each having an array of memory cells includes address control circuitry for presenting address bits to the row and column decoders of the memory banks and switching the row and column addresses presented to the different banks. Address control circuitry may be a translation look ahead buffer or may include an address translator, a row address buffer, and a column address buffer. The memory subsystem may also include input/output circuitry for inputting address bits in response to row address strobe and column address strobe signals. Input/output circuitry may allow both serial and parallel access to the multiple memory banks. A method for accessing the memory subsystem includes addressing a row in the array of a first memory bank using a first set of address bits, addressing a column in the array of the first memory bank using a second set of address bits, accessing a cell at the intersection of the selected row and selected column in the first memory bank, addressing a row in the array of a second memory bank using the second set of address bits, addressing a column in the array of the second memory bank using the first set of address bits, accessing a cell at the intersection of the selected row and selected column in the second memory bank.

22 Claims, 4 Drawing Sheets

MULTI-BANK MEMORY SYSTEM AND METHOD HAVING ADDRESSES SWITCHED BETWEEN THE ROW AND COLUMN DECODERS IN DIFFERENT BANKS

TECHNICAL FIELD OF THE INVENTION

The present invention relates in general to electronic circuits and systems and in particular to a memory architecture using conserved addressing and systems and methods using the same.

BACKGROUND OF THE INVENTION

A typical processing system with video/graphics display capability includes a central processing unit (CPU), a display controller coupled to the CPU by a CPU local bus (directly and/or through core logic), a system memory coupled to the CPU local bus through core logic, a frame buffer memory coupled to the display controller via a Peripheral Component Interconnect local bus (e.g., PCI bus), peripheral circuitry (e.g., clock drivers and signal converters, display driver circuitry), and a display unit.

The CPU is the system master and generally provides overall system control in conjunction with the software operating system. Among other things, the CPU communicates with the system memory, holding instructions and data necessary for program execution, through core logic. Typically, the core logic is two to seven chips, with one or more chips being "address and system controller intensive" and one or more other chips being "data path intensive." The CPU also, in response to user commands and program instructions, controls the content of the graphics images to be displayed on the display unit by the display controller.

The display controller, which may be, for example, a video graphics array (VGA) controller, generally interfaces the CPU and the display driver circuitry, manages the exchange of graphics and/or video data between the frame buffer and the CPU and the display during display data update and screen refresh operations, controls frame buffer memory operations, and performs additional basic processing on the subject graphics or video data. For example, the display controller may also include the capability of performing basic operations such as line draws and polygon fills. The display controller is for the most part a slave to the CPU.

As the data processing capacity of CPUs continues to increase, the demands on the associated memory resources, such as the system memory, correspondingly increase. This is particularly true with Very Long Instruction Word (VLIW) and Reduced Instruction Set Computing (RSIC) processors which not only require more memory capacity than the more widely used Complex Instruction Set Computing (CISC) CPUs, but higher memory bandwidth as well. To meet these increased demands on memory as VLIW and RISC processors become increasingly popular, there is a significant need to develop new memory devices which provide not only more bits of storage per chip but which also can directly support the increasingly wider data paths required by advanced processors.

However, many problems arise when attempting to develop cost effective single-chip memory devices with high bit density and/or wide data ports, even when multi-banked and multi-arrayed architectures are considered. Among other things, the pin count of standard packaging limits the width of the data port and requires multiplexing of the address port. Further, in order to maintain operating power at a reasonable level, the number of sense amplifiers and clocks must be minimized. Additionally, peripheral overhead must be constrained if multiple banks are to be used (i.e. the number of control signals must be minimized). Finally, the die size must be acceptable (yieldable).

Thus, the need has arisen for an improved memory architecture which allows for the implementation of high capacity/high bandwidth memory devices and systems. In particular, such an architecture should be applicable, although not limited to, the implementation of cost-effective dynamic random access memory (DRAM) devices with high capacity and high bandwidth.

SUMMARY OF THE INVENTION

According to one embodiment of the principles of the present invention, a memory subsystem is provided which includes a first memory bank including an array of memory cells, a row decoder for selecting a row in the array of the first bank and a column decoder for selecting at least one column in the array of the first bank. The memory subsystem also includes a second memory bank including an array of memory cells, a row decoder for selecting a row in the array of the second bank and a column decoder for selecting at least one column in the array of the second bank. Address control circuitry is provided for presenting a first set of address bits to the row decoder of the first bank and the column decoder of the second bank, and for presenting a second set of address bits to the column decoder of the first bank and the row decoder of the second bank.

According to another embodiment of the present invention, a memory device is provided which includes a plurality of memory banks. Each memory bank includes an array of memory cells. Each memory bank also includes a row decoder for selecting a row of cells in the array of memory cells for that bank in response to a row address, and a column decoder for accessing at least one cell along a selected row in response to a column address. The memory device also includes address control circuitry which is operable to receive first and second sets of address bits. The address control circuitry presents the first set of address bits to the row decoder of a first selected one of the banks, and presents the second set of address bits to the column decoder of the first bank for accessing at least one selected cell in the array of the first bank. The address control circuitry also presents the first set of address bits to the column decoder of a second selected one of the banks, and presents the second set of address bits to the row decoder of the second selected bank for accessing at least one selected cell in the array of the second bank.

The principles of the present invention are further embodied in a processing system which includes a bus, a processor coupled to the bus, core logic coupled to the bus, and a memory coupled to the bus. The memory includes input/output circuitry operable to receive first and second sets of address bits from the core logic via the bus. The memory also includes a plurality of arrays of rows and columns of memory cells. The memory further includes addressing circuitry for selecting a row in a first selected one of the arrays and at least one column in a second selected one of the arrays in response to the first set of address bits, and for selecting at least one column in the first selected array and a row in the second selected array in response to the second set of address bits.

The principles of the present invention are also embodied in methods for accessing data in a memory subsystem including first and second memory banks, where each bank includes an array of rows and columns of memory cells and associated addressing circuitry. According to one method, a row in the array of the first bank is addressed using a first set of address bits and a column in the array of the first bank is addressed using a second set of address bits. A memory cell at an intersection of the selected row and the selected column of the array of the first bank is accessed. A row in the array of the second bank is addressed using the second set of address bits while a column in the array of the second bank is addressed using the first set of address bits. A memory cell at the intersection of the selected row and the selected column of the array of the second bank is accessed.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

Figure 1A:
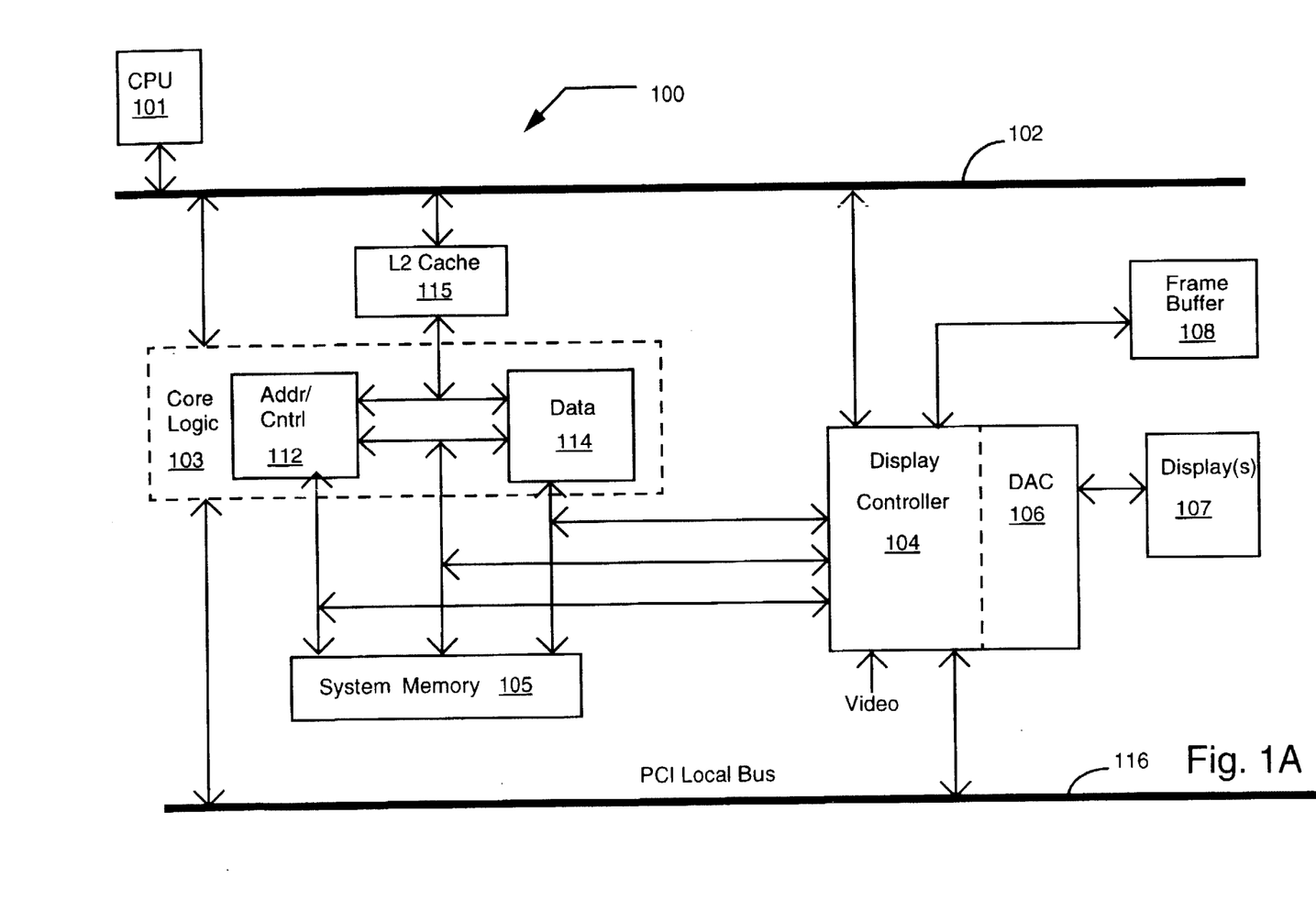
FIGS. 1A and 1B are high level functional block diagrams of exemplary information processing systems in which one or more memories embodying the principles of the present invention may be employed.
Figure 1B:
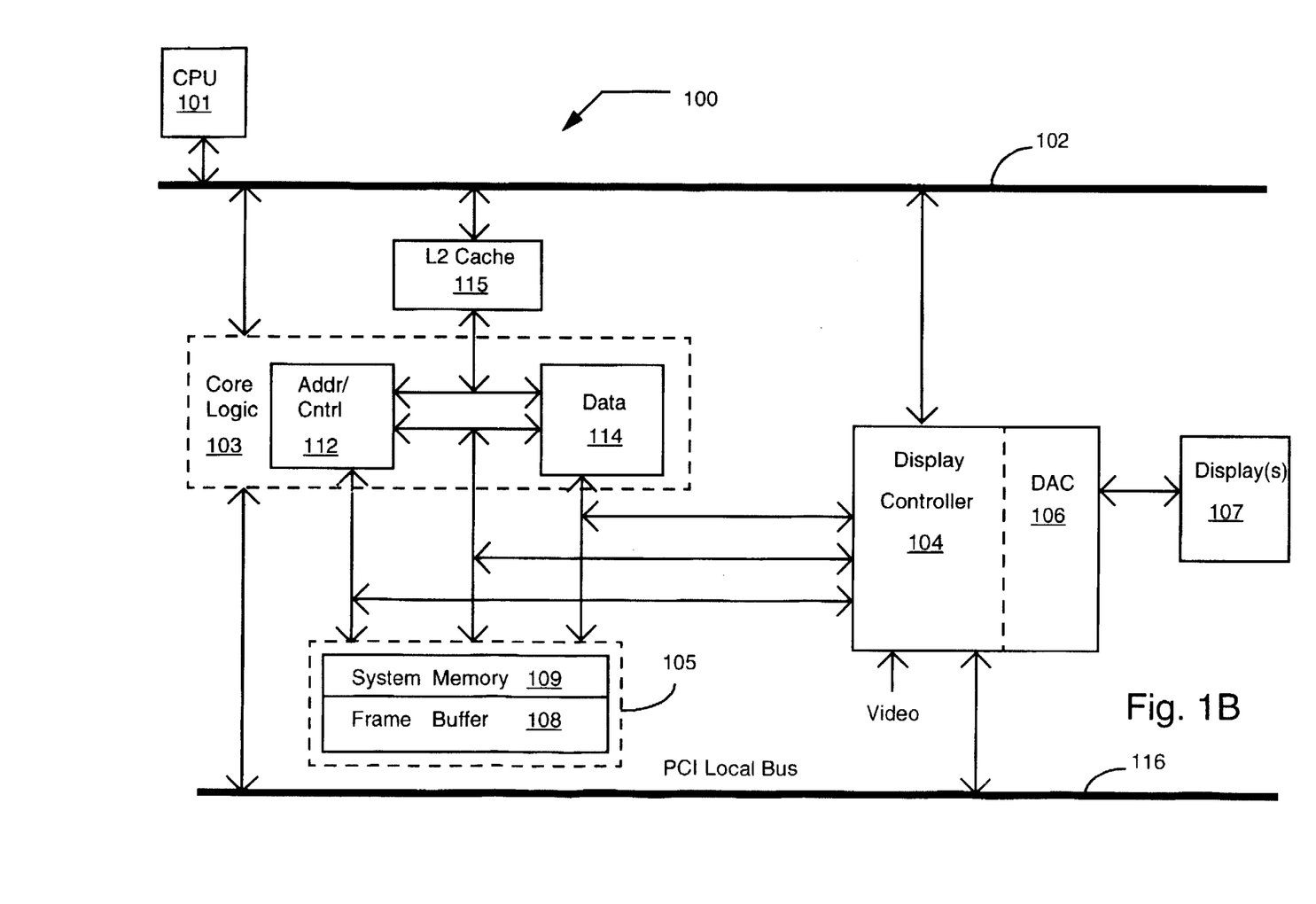
Figure 2:
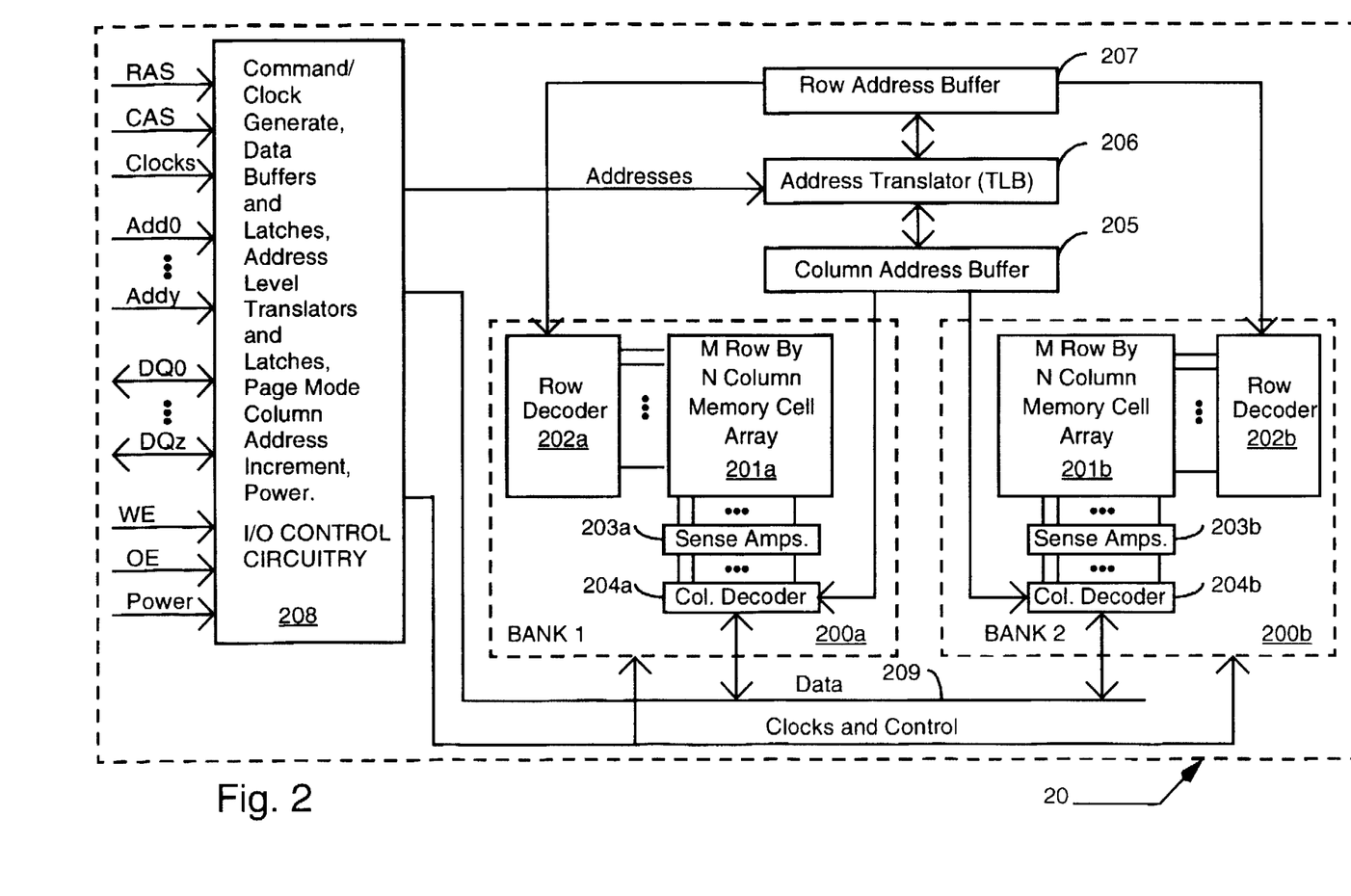
FIG. 2 is a functional block diagram of a multi-bank memory subsystem with conserved addressing according to the principles of the present invention.
Figure 3:
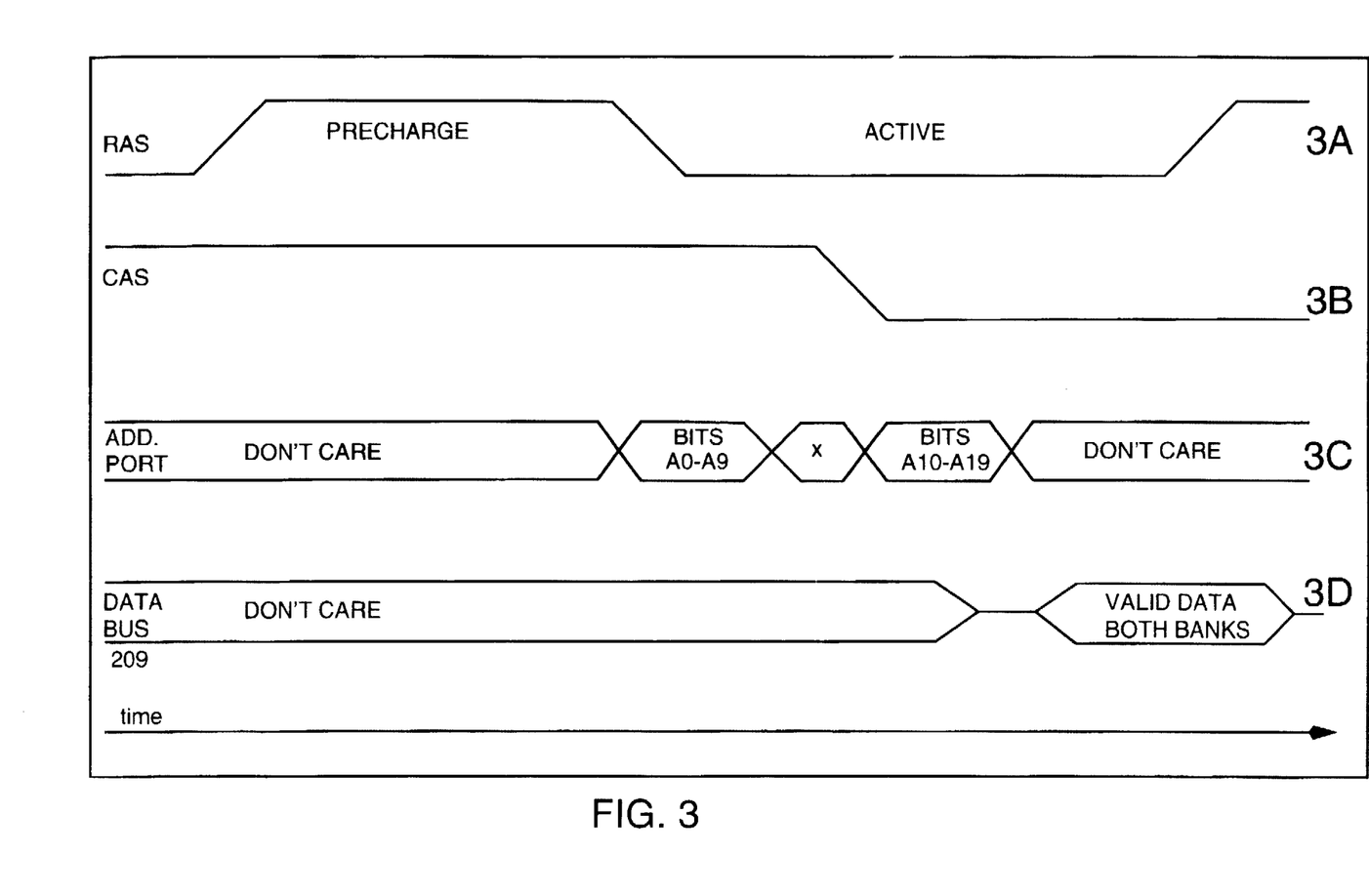
FIG. 3, comprising waveforms 3A to 3D, is a timing diagram illustrating an exemplary (read) operation as performed by the multi-bank memory system of FIG. 2.

The principles of the present invention and their advantages are best understood by referring to the illustrated embodiment depicted in FIGS. 1-3 of the drawings, in which like numbers designate like parts. While memory devices embodying the principles of the present invention are useful in a wide number of applications, for purposes of illustration, such memory devices will be described in conjunction with a basic processing system architecture typically employed in personal computers.

FIG. 1a is a high level functional block diagram of the portion of a processing system 100. System 100 includes a central processing unit (CPU) 101, a CPU local bus 102, core logic 103, a display controller 104, a system memory 105, a digital to analog converter (DAC) 106, frame buffer 108, and a plurality of optional display devices 107.

CPU 101 is the "master" which controls the overall operation of system 100. Among other things, CPU 101 performs various data processing functions and determines the content of the graphics data to be displayed on display devices 107 in response to user commands and/or the execution of application software. CPU 101 may be for example a general purpose microprocessor, such as an Intel® (Santa Clara, Calif.) Pentium® class microprocessor or the like, used in personal computers. CPU 101 communicates with the remainder of system 100 via CPU local bus 102, which may be for example a special bus, or a general bus (common in the industry).

Core logic 103, under the direction of CPU 101, controls the exchange of data, addresses, control signals and instructions between CPU 101, display controller 104, and system memory 105. Core logic 103 may be any one of a number of commercially available core logic chip sets designed for compatibility with the remainder of the system, and in particular with CPU 101. One or more core logic chips, such as chip 112 in the illustrated system, are typically "address and system controller intensive" while one or more core logic chips, such as chip 114 in FIG. 1, are "data intensive." Address intensive core logic chip 112 generally: interfaces CPU 101 with the address path of CPU bus 102; maintains cache memory, including the cache tags, set associative cache tags and other data necessary to insure cache coherency; performs cache "bus snooping"; generates the control signals required for DRAMs in the system memory or cache; and controls general management transactions. Data intensive chip 114 generally: interfaces CPU 101 with the data path of CPU bus 102; issues cycle completion responses to address chip 112 or CPU 101; may abort operations if their cycles are incomplete; and arbitrates for the data path of bus 102.

CPU 101 can directly communicate with core logic 103 or through an external (L2) cache 115. L2 cache 115 may be for example a 256K Byte fast static random access memory (SRAM) device(s). It should be noted that CPU 101 can also include on-board (L1) cache, typically up to 16 kilobytes.

Display controller 104 may be any one of a number of commercially available VGA display controllers. For example, display controller 104 may be one of the Cirrus Logic CL-GD754x series of display controllers. The structure and operation of such controllers is described in CL-GD7542 GUI-Accelerated SVGA LCD Controller with MVA Multimedia for Portable Computers Preliminary Data Book, Version 1.3, November 1994, available from Cirrus Logic, Inc., Fremont, Calif., and incorporated herein by reference. Display controller 104 may receive data, instructions and/or addresses from CPU 101 either through core logic 103 or directly from CPU 101 through CPU local bus 102. Data, instructions, and addresses are exchanged between display controller 104 and system memory 105 through core logic 103. Further, addresses and instructions may be exchanged between core logic 103 and display controller 104 via a local bus 116 which may be for example a PCI local bus. Generally, display controller 104 controls screen refresh, executes a limited number of graphics functions such as line draws, polygon fills, color space conversion, display data interpolation and zooming, and video streaming, and handles other ministerial chores such as power management. Most importantly, display controller 104 controls the raster of pixel data from frame buffer 108 to display unit 107 during screen refresh and interfaces CPU 101 and frame buffer 108 during display data update. Video data may be directly input into display controller 104.

Digital to analog converter 106 receives digital data from controller 104 and outputs the analog data to drive display devices 107 in response. In the illustrated embodiment, DAC 106 is integrated with display controller 104 onto a single chip. Depending on the specific implementation of system 100, DAC 106 may also include a color palette, luminance and chrominance color space (YUV) to red/green/blue (RGB) color space format conversion circuitry.

and/or X- and Y- zooming circuitry, to name a few options. Display devices 107 may be for example a CRT unit, a liquid crystal display, electroluminescent display, plasma display, or other type of display device which displays images on a screen as a plurality of pixels. It should also be noted that in alternate embodiments, display devices 107 may be another type of output device such as a laser printer or similar document view/print appliance.

The data paths in system 100 will vary with each design. For example, system 100 may be a "64-bit" or "72-bit" system. Assume for discussion purposes that a 64-bit system is chosen. Then, each of the data connections, including the data paths of CPU bus 102 and PCI bus 116, the data paths through core logic 103 to system memory 109 and display controller 104, and the data interconnection between display controller 104 and frame buffer 108, are all 64 bits wide. It should be noted that the address interconnections will vary depending on the size of the memory and such factors as the need to support data byte select, error detection correction, and virtual memory operations. In a typical CPU processor system today, the address portions of CPU bus 102 and PCI bus 116 are typically on the order of 30 bits wide.

FIG. 1B is an alternate system architecture to which the principles of the present invention may be advantageously applied. In this example, memory 105 is a "unified" memory system since the system memory 109 and frame buffer 108 are collocated in a single integrated circuit or bank of integrated circuits. This is in contrast to those systems in which the frame buffer is separate and apart from the system memory and interfaces with the remainder of the system through the display controller. System memory 109 again is preferably a traditional system memory which stores data, addresses, and instructions under the command of CPU 101 as required for executing various processing functions and applications programs. As in traditional systems, the frame buffer 108 stores the pixel data required to generate the required images on the screen of display devices 107.

FIG. 2 is a functional block diagram of a memory 20 embodying the principles of the present invention. In the preferred embodiment, memory 20 is fabricated on single integrated circuit chip, although the present invention is not limited to single chip embodiments.

Memory 20 is arranged in the illustrated embodiment as two independently addressable banks 200a and 200b (BANK 1 and BANK 2). Each bank 200 includes an array 201 of memory cells organized in M number of rows and N number of columns, in the preferred embodiment, the memory cells are dynamic random access memory (DRAM) cells, although in alternate embodiments other memory devices, such as static random access memory (SRAM) cells or ferroelectric random access memory (FRAM) cells, may be used. For discussion purposes, assume that each array bank 200 is organized as 1 Megabit×1 with each array 201 arranged in 1,024 rows and 1,024 columns.

The cells of each row of each array 201 are controlled by a conductive wordline which is controlled by an associated row decoder 202. Preferably, row decoders 202 are conventional row decoders each of which selects one row per received row address for access by precharging to a logic high the corresponding wordline.

The columns of each array 201 include at least one bitline (typically, one bitline per column if DRAM cells are used, two if SRAM cells are used). In the preferred embodiment, the bitlines of each array are coupled to a bank of conventional sense amplifiers 203 and a conventional column cells along the selected row during an access. Each column decoder selects one or more columns for access (read or write) per received column address. The I/O word (location) width for each bank 200 is 1 bit in the present example where a by 1 (×1) device is being considered. Thus 1 cell from 1 column along a selected row is accessed through the corresponding column decoder 204. During a read, data from the accessed location is passed to data read latches within circuitry 208. During a write, write buffers within circuitry 208 drive data through column decoders 204 and sense amplifiers 203 to the accessed location.

In the preferred embodiment, row decoders 202, sense amplifiers 203 and column decoders 204 are dynamic circuitry known in the art. Typical dynamic decoding and sensing circuitry, as well as a clocking scheme for controlling the active and precharge cycles of the illustrated dynamic circuitry is illustrated in "*A 5-volt Only 64k DRAM*", L. S. White, N. H. Hong, D. J. Redwine, and G. R. Mohan Rao, International Solid State Circuit Conference 1980, Digest of Technical Papers, pp. 230–231, incorporated herein by reference.

Some of the fundamental principles of DRAM operation are additionally described in: "*A 64-k Dynamic RAM Needs Only One 5-volt Supply to Outstrip 16k Parts*", G. R. Mohan Rao and John Hewkin, Electronics, Sep. 28, 1978, pp. 109–116; "*A 1 Mb DRAM With Design-For-Test Functions*," J. Neal, B. Holland, S. Inoue, W. K. Loh, H. McAdams and K. Poteet, International Solid State Circuit Conference 1986, Digest of Technical Papers, pp. 264–265; "*A 4 Mb DRAM With Half Internal-Voltage Bitline Precharge*", International Solid State Circuit Conference 1986, Digest of Technical Papers, pp. 270–271; "*A Full Bit Prefetch Architecture For Synchronous DRAMs*", T. Sunaga, K. Hosokawa, Y. Nakamura, M. Ichinose, A Moriwaki, S. Kakimi and N. Kato, IEEE Journal of Solid State Circuits, Vol 30., No. 9, September 1995, pp. 994–1005; and "*DRAM Macros For ASIC Chips*", IEEE Journal of Solid State Circuits, Vol 30., No. 9, September 1995, pp. 1006–1014, each incorporated herein by reference.

In the preferred embodiment, addresses are provided to row decoders 202 and column decoders 204 through a column address buffer 205, address translator 206 and a row address buffer 207. The operation of these circuit blocks will be discussed further below.

Input/output control circuitry 208 interfaces memory 200 with external circuitry, such as core logic 103 in the systems described above. Circuitry 208 includes conventional data and address buffers and latches, including the data read latch and write buffers described above, address level translators, clock generation circuitry, and page mode column address incrementation/jump circuitry. Preferably, circuitry 208 latches in row addresses and column addresses word-serial in the sense that words of incoming data are latched into word by word circuitry 208 from a multiplexed address bus in response to a row address strobe ($\overline{RAS}$) signal and a column address strobe signal ($\overline{CAS}$) respectively. In synchronous DRAM designs, a master clock dictates the basic DRAM operation.

In the present example, where each bank 200 has a 1 megabit by 1 (×1) configuration with 1,024 by 1,024 cell arrays 201, 10 row and 10 column address bits are required for a random access to a given 1-bit location of a given bank (i.e. 10 address bits provides for a 1 out of 1,024 selection). For discussion purposes, assume address bits A0–A9 are the row address bits and address bits A10–A19 are the column Accesses (reads and writes) are preferably made to the memory arrays 201 as follows. An exemplary timing diagram is provided as FIG. 3. During the period when RAS is high, memory 20 is in precharge. Preferably, both banks 200 are precharged at once although staged precharging could also be employed. During precharge, various nodes in the dynamic circuitry, such as the dynamic circuitry of row and column decoders 202 and 204 and sense amplifiers 203, discussed above, are brought to predetermined voltages. In particular, sense amplifiers 203 are equalized during the precharge period.

The active period begins when RAS transitions low. A row address composed of bits A0–A9 is received from core logic 103 and latched into the address latches within circuitry 208 with the falling edge of RAS. Next, a column address composed of bits A10–A19 is received from core logic 103 and latched-in to the address latches with the falling edge of CAS.

Address translator 206, which is preferably a translation look ahead buffer, directs the received row address bits A0–A9 to the bank 1 row decoder 202a through row address buffer 207 and directs the received column address bits A10–A19 through column address buffer 205 to bank 1 column decoder 204a. In the present example, a 1-bit location (cell) is then accessed through data bus 209. After the access to bank 1 has been made, the bank 1 dynamic circuitry, including of row decoder 202a, sense amplifiers 203a, and column decoder 204a, is preferably turned-off to save power. If staged precharge is used, bank 2 still may be under precharge during at least part of the time during which bank 1 is being accessed.

Next, address translator 206 directs address bits A0–A9 to bank 2 column decoder 204b and address bits A10–A19 to bank 2 row decoder 202b. In other words, the row and column addresses used to access bank 1 take reverse roles with regards to bank 2 and become the bank 2 column and row addresses respectively. The addressed cell of bank 2 array 201b is then accessed across data bus 209. The dynamic circuitry of bank 2, including row decoder 202b, sense amplifiers 203b, and column decoder 204b, is turned-off after the access to conserve power. With the rising edge of RAS, both bank 1 and bank 2 transition into precharge.

During a read, each 1-bit word accessed from banks 1 and 2 respectively may be output word-serial, (i.e. word by word), through input/output and control circuitry 208. In this case, only 1 data pin (DQ0) is required. Alternatively, banks 1 and 2 may also be accessed in parallel. The two 1-bit words may be concatenated into a single 2-bit word, such as with a register or latch, and output through a 2-pin data port (pins DQ0 and DQ1). Similarly, during a write, input can be made either as a single 2-bit word through 2 pins or as two 1-bit words received word-serial through 1 pin. In each case, 1-bit words are sequentially passed to bank 1 and bank 2 during their respective accesses.

As discussed above, in the illustrated embodiment each bank 200 is organized as a 1 Megabit by 1 (×1) subsystem with each array 201 consisting of 1,024 rows and 1,024 columns of memory cells. As a consequence, 10 row and 10 column address bits are required to access each one bit location. In alternate embodiments, other organizations such as by 4 (×4), by 8 (×8), by 16 (×16), and so on may be used. Preferably, in these alternate embodiments asymmetrical arrays 201 are employed such that the number of row addresses required to completely address the rows of array 201a is equal to the number of column addresses required to For example, assume that each bank 200 is organized as a by 4 (×4) subsystem with four cells from four columns along a selected row accessed per column address. In this case, each array 201 may be organized as 256 rows and 1024 columns. Then for example, 8 address bits may be used both to address any one row in one array 201 and any 4 columns in the other array in the other array 201 to access a 4-bit location. In other words, the row addresses to each bank 200 map bit for bit to the column addresses to the other bank 200.

It should be noted that the principles of the present invention are not limited to multiple-bit location subsystems with asymmetrical arrays such as the by 4 (×4) subsystem discussed above. If symmetrical arrays are used in multiple-bit location embodiments, however, the number of required row and column address bits will not be equal. Assume for discussion purposes that each bank 200 is organized as a 4 (×4) by subsystem bank. Also assume that each array 201 consists of 1,024 rows and 1,024 columns. Then, 10 row address bits and 8 column bits are required to completely address each array 201. According to the principles of the present invention ten bits are still presented to each column decoder 204 by translator 206 and decoded, although only 8 of those bits select the columns to be accessed. Ten bits are still required to individually select one of 1024 rows. Thus, multiple rows in the first bank 200 will map to a single location (group of columns) in the second bank 2 after translation by translator 203. In this case, CPU 101 and core logic 103 look ahead when generating a row address to the first bank 200 in order to simultaneously access appropriate columns in the second bank 200 after translation. CPU 101 may, for example, place data fields associated with the data fields accessed from multiple rows in bank 1 in a single location or set of locations in bank 2 or simply may disable the input/output of data through circuitry 208 to the corresponding location in bank 2 for a given row address or addresses mapping to that location. Alternatively, translation of row address bits in bank 1 into column addressses in bank 2 may be disabled for certain row addresses when multiple row addresses in bank 1 map to the same group of columns in bank 2.

Memories, such as memory 20, embodying the principles of the present invention have substantial advantages over the prior art. Among other things, two rows, one from each array, can be accessed in a single RAS cycle. Further, addresses are "conserved" since two locations can be accessed per each row and column address. This is particularly advantageous when large blocks locations in arrays 201 are being accessed (up to the entire memory space of arrays 201a and 201b combined) since the number of required addresses and RAS cycles is halved. Additionally, since the arrays 201 in the preferred embodiment are sequentially turned-on and accessed, a substantial amount of power can be saved. This is particularly true if staged precharge is employed. Finally, it should be recognized that in conventional multiple-bank devices, to randomly access two banks, not only are two RAS cycles and two external row addresses required, but also an additional bank select bit. Memories embodying the present invention also do not require a bank select bit to switch banks during accesses.

Memories such as memory 20 can be employed in a number of applications including system memory 105, frame buffer 108, and unified system/frame buffer memory 105. In particular, the principles of the present invention are useful in applications where streams of data are required, as is found with frame buffers.

Although the present invention and its advantages have changes, substitutions and alterations can be made herein without departing from the spirit and scope of the invention as defined by the appended claims.

What is claimed is:

1. A memory subsystem comprising:
    a first memory bank including an array of memory cells, a row decoder for selecting a row in said array of memory cells of said first memory bank, and a column decoder for selecting at least one column in said array of memory cells of said first memory bank;
    a second memory bank including an array of memory cells, a row decoder for selecting a row in said array of memory cells of said second memory bank, and a column decoder for selecting at least one column in said array of memory cells of said second memory bank; and
    address control circuitry for presenting a first set of address bits to said row decoder of said first memory bank and for presenting said first set of address bits to said column decoder of said second memory bank, and for presenting a second set of address bits to said column decoder of said first memory bank and for presenting said second set of address bits to said row decoder of said second memory bank.

2. The memory subsystem of claim 1, wherein said arrays of memory cells comprise arrays of dynamic random access memory cells.

3. The memory subsystem of claim 1, wherein said arrays of memory cells comprise arrays of static random access memory cells.

4. The memory subsystem of claim 1, wherein said address control circuitry comprises an address translator.

5. The memory subsystem of claim 4, wherein said address translator comprises a look ahead buffer.

6. A memory device comprising:
    a plurality of memory banks each including an array of memory cells, a row decoder for selecting a row of cells in the array in response to a row address, and a column decoder for accessing at least one cell along a selected row in response to a column address; and
    address control circuitry operable to:
        receive first and second sets of address bits;
        present said first set of address bits to the row decoder of a first selected one of said memory banks, and present said second set of address bits to the column decoder of said first selected one of said memory banks for accessing at least one selected cell in the array of said first selected one of said memory banks; and
        present said first set of address bits to the column decoder of a second selected one of said memory banks, and present said second set of address bits to the row decoder of said second selected one of said memory banks for accessing at least one selected cell in the array of said second selected one of said memory banks.

7. The memory device of claim 6 wherein said address control circuitry comprises a translation look ahead buffer.

8. The memory device of claim 6, wherein said address control circuitry comprises:
    an address translator for receiving said first and second sets of address bits;
    a row address buffer for interfacing said address translator with the row decoder of each of said memory banks; and
    a column address buffer for interfacing said address translator with the column decoder of each of said memory banks.

9. The memory device of claim 6, further comprising input/output circuitry inputting said first set of address bits in response to a row address strobe signal and said second set of address bits in response to a column address strobe signal.

10. The memory device of claim 6, further comprising input/output circuitry allowing sequential access of said at least one selected cell in the array of said first selected memory bank and said at least one selected cell in the array of said second selected memory bank by an external device.

11. The memory device of claim 6, further comprising input/output circuitry allowing parallel access of said at least one selected cell in the array of said first selected memory banks.

12. The memory device of claim 6, wherein said address control circuitry presents said first and second sets of address bits to the row and column decoders of said first and second selected memory banks to effectuate a sequential access of said first and second selected memory banks.

13. The memory device of claim 12, wherein said first selected memory bank and said second selected memory bank include dynamic circuitry and said dynamic circuitry of said first selected memory bank is turned-off during access to said and second selected memory bank.

14. A processing system comprising:
    a bus;
    a processor coupled to said bus;
    core logic coupled to said bus; and
    a memory coupled to said bus and comprising:
        input/output circuitry operable to receive first and second sets of address bits from said core logic via said bus;
        a plurality of arrays of rows and columns of memory cells; and
        addressing circuitry for selecting a row in a first selected one of said arrays and at least one column in a second selected one of said arrays in response to said first set of address bits, and at least one column in said first selected one of said arrays and a row in said second selected one of said arrays in response to said second set of address bits.

15. The system of claim 14 wherein said input/ouptut circuitry is operable to latch-in said first set of address bits in response to a row address strobe signal received from said core logic and latch-in said second set of address bits in response to a column address strobe signal received from said core logic.

16. The memory of claim 14 wherein said first set of address bits comprises a row address to said first selected one of said arrays generated by said core logic and said second set of address bits comprises a column address to said first selected one of said arrays generated by said core logic.

17. The system of claim 14 wherein said addressing circuitry includes:
    a first row decoder for selecting a row in said first selected one of said arrays;
    a second row decoder for selecting a row in said second selected one of said arrays;
    a first column decoder for selecting at least one column in said first selected one of said arrays;
    a second column decoder for selecting at least one column in said second selected one of said arrays;
    a row address buffer coupled to said first and second row decoders;
    a column address buffer coupled to said first and second column decoders; and an address translator operable to direct said first set of address bits through said row address buffer to said first row decoder and to direct said first set of address bits through said column address buffer to said second column decoders and to direct said second set of address bits through said row address buffer to said second row decoder and to direct said second set of address bits through said column address buffer to said first column decoder.

18. The system of claim 14 wherein said arrays comprise arrays of dynamic random access memory cells.

19. The system of claim 14 wherein said processor comprises a central processing unit.

20. A method of accessing data in a memory subsystem including first and second memory banks, each bank including an array of rows and columns of memory cells and associated addressing circuitry, the method comprising the steps of:

addressing a row in the array of the first memory bank using a first set of address bits;

addressing a column in the array of the first memory bank using a second set of address bits;

accessing a memory cell at an intersection of the selected row and the selected column of the array of the first memory bank;

addressing a row in the array of the second memory bank using the second set of address bits;

addressing a column in the array of the second memory bank using the second set of address bits; and accessing a memory cell at an intersection of the selected row and the selected column of the array of the second memory bank.

21. The method of claim 20 and further comprising the step of deactivation the addressing circuitry of the first memory bank after said step of accessing a memory cell of the array of the first memory bank.

22. The method of claim 20 wherein said steps of accessing a memory cell in the array of the first memory bank and accessing a memory cell in the array of the second memory bank are preformed sequentially.

* * * * *